United States Patent
Arai et al.

(10) Patent No.: US 9,807,896 B2
(45) Date of Patent: Oct. 31, 2017

(54) CONVERTER

(71) Applicant: YOKOGAWA ELECTRIC CORPORATION, Musashino-shi, Tokyo (JP)

(72) Inventors: Takashi Arai, Musashino (JP); Masayuki Ishii, Musashino (JP); Yuichi Hori, Musashino (JP); Akira Uehara, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 0 days.

(21) Appl. No.: 14/731,642

(22) Filed: Jun. 5, 2015

(65) Prior Publication Data

US 2015/0366091 A1 Dec. 17, 2015

(30) Foreign Application Priority Data

Jun. 11, 2014 (JP) .................. 2014-120716

(51) Int. Cl.
- *H05K 5/02* (2006.01)
- *G01D 11/24* (2006.01)
- *H05K 7/14* (2006.01)

(52) U.S. Cl.
CPC ......... *H05K 5/0239* (2013.01); *G01D 11/245* (2013.01); *H05K 7/1462* (2013.01)

(58) Field of Classification Search
CPC ............... H05K 5/0239; H05K 7/1462; H05K 2201/0707; H05K 2201/10371; H05K 9/0071; H05K 5/0213; G01D 11/245
USPC .................... 361/679.01, 800, 816
See application file for complete search history.

(56) References Cited

U.S. PATENT DOCUMENTS

| | | | |
|---|---|---|---|
| 2,555,691 A | 6/1951 | Hamby | |
| 4,484,690 A | 11/1984 | Nash | |
| 5,334,043 A * | 8/1994 | Dvorak, Jr. | ......... G01R 1/07328 439/364 |
| 6,086,975 A | 7/2000 | Brick et al. | |
| 6,366,436 B1 * | 4/2002 | Maier | ..................... G01F 15/06 361/93.9 |
| 9,030,190 B2 * | 5/2015 | Matt | .................... G01D 11/245 324/156 |
| 9,261,385 B2 * | 2/2016 | Loeffel | .................. G01D 11/24 |
| 2004/0036819 A1 * | 2/2004 | Ryu | ...................... G06F 1/1601 349/58 |
| 2007/0148058 A1 * | 6/2007 | Buckel | .................. F01N 3/2839 422/180 |

(Continued)

FOREIGN PATENT DOCUMENTS

| | | | |
|---|---|---|---|
| DE | 102011086108 A1 | 5/2013 | |
| JP | 36435 A | 1/1991 | |

(Continued)

OTHER PUBLICATIONS

Communication dated Oct. 29, 2015, from the European Patent Office in counterpart European Application No. 15169511.1.

*Primary Examiner* — Steven T Sawyer
*Assistant Examiner* — Sagar Shrestha
(74) *Attorney, Agent, or Firm* — Sughrue Mion, PLLC

(57) ABSTRACT

A converter includes an amplifier case main body having an amplifier main body accommodated therein, and a safety cover attached to the amplifier case main body. The safety cover has a plurality of through-holes for as removal.

4 Claims, 2 Drawing Sheets

(56) References Cited

U.S. PATENT DOCUMENTS

| | | | | |
|---|---|---|---|---|
| 2009/0029641 A1* | 1/2009 | Furuuchi | ............... | F16K 15/147 |
| | | | | 454/259 |
| 2010/0171506 A1* | 7/2010 | Norgaard | ............. | G01N 27/626 |
| | | | | 324/468 |
| 2011/0023471 A1* | 2/2011 | Werni | .................... | F01N 3/035 |
| | | | | 60/297 |
| 2011/0194250 A1* | 8/2011 | Perkins, III | .......... | H05K 7/1434 |
| | | | | 361/690 |
| 2011/0317390 A1* | 12/2011 | Moser | .................. | G01D 11/245 |
| | | | | 361/807 |
| 2013/0319118 A1* | 12/2013 | Deng | ..................... | G01H 11/08 |
| | | | | 73/514.32 |
| 2015/0028730 A1* | 1/2015 | Loeffel | .................. | G01D 11/24 |
| | | | | 312/223.1 |
| 2015/0049452 A1* | 2/2015 | Franck | .................... | H05K 7/14 |
| | | | | 361/809 |
| 2015/0334863 A1* | 11/2015 | Beer | .................... | H05K 5/0213 |
| | | | | 220/745 |

FOREIGN PATENT DOCUMENTS

| | | | | |
|---|---|---|---|---|
| JP | 835336 A | 2/1996 | | |
| JP | 11138669 A | 5/1999 | | |
| JP | 2006129545 | * 5/2006 | ............... | H02G 3/22 |
| JP | 3126053 U | 10/2006 | | |
| JP | 2012112854 | * 6/2012 | ............... | G01F 1/00 |
| JP | 2013-108790 A | 6/2013 | | |

* cited by examiner

CONVERTER

CROSS-REFERENCE TO RELATED APPLICATION

The present application claims priority from Japanese Patent Application No. 2014-120716 filed on Jun. 11, 2014, the entire content of which is incorporated herein by reference.

BACKGROUND

The present invention relates to a converter, and more particularly to improvements on safety.

FIG. 4 illustrates a configuration of an example of a related-art converter. In FIG. 4, an amplifier case main body 1 has a cylindrical shape, and an amplifier main body (not shown) is accommodated in the amplifier case main body 1.

Components configuring the amplifier main body accommodated in the amplifier case main body 1 include a component that is applied with a high voltage during an operation thereof or a component of which temperature is increased to high temperatures during the operation thereof. In case that the amplifier main body is exposed at an inside of the amplifier case main body 1, when a maintenance operation, an adjustment operation and the like are performed at a state where the converter is operating, an operator may contact the amplifier main body so that the operator may get a shock or suffer a burn. That is, the operator is exposed to a hazard.

Therefore, the amplifier case main body 1 having the amplifier main body 8 accommodated therein is attached with a safety cover 2. An indicator 3 is attached to the safety cover 2. A window glass cover 4 is attached to an opening of the amplifier case main body 1 so that the safety cover 2 and the indicator 3 are contained therein. In the meantime, a main plane 21 of the safety cover 2 is provided with a window 5 through which a wiring for connecting the amplifier main body and the indicator 3 each other is enabled to pass.

Patent Document 1 discloses a technology of a converter case for implementing standardization of components and improvement of extendability.

[Patent Document 1] Japanese Patent Application Publication No. 2013-108790A

However, according to the related-art configuration shown in FIG. 4, when an explosion test of explosion proof is performed, an explosion pressure directed towards the window glass cover 4 is interrupted by the safety cover 2 and the explosion pressure is directly applied to the safety cover 2, so that the safety cover 2 is damaged.

Further, the explosion pressure is irregularly applied from the damaged part of the safety cover 2, and an excessive explosion pressure may be applied to the window glass cover 4 due to pressure piling. In the meantime, the pressure piling indicates a phenomenon that a pressure of mixed gases in a separate compartment pressurized due to explosion occurring from any compartment in a container is further increased due to secondary explosion.

SUMMARY

Exemplary embodiments of the invention provide a converter having a structure capable of reducing a damage of a safety cover to reduce an explosion pressure due to pressure piling applied to a window glass cover.

A converter according to an exemplary embodiment of the invention comprises:

an amplifier case main body having an amplifier main body accommodated therein; and a safety cover attached to the amplifier case main body, wherein the safety cover has a plurality of through-holes for gas removal.

The through-holes for gas removal may be circumferentially provided on a main plane of the safety cover.

The through-holes for gas removal may be provided in a mesh structure on a main plane of the safety cover.

An inner diameter of each of the through-holes for gas removal may be formed to be slightly smaller than an outer diameter of a predetermined test pin.

According to the present invention, an explosion pressure in the amplifier case main body is enabled to come out through the plurality of through-holes for gas removal provided for the safety cover. Thereby, it is possible to implement the converter capable of reducing not only a damage of the safety cover but also the explosion pressure due to the pressure piling applied to the window glass cover.

DETAILED DESCRIPTION

Figure 1:
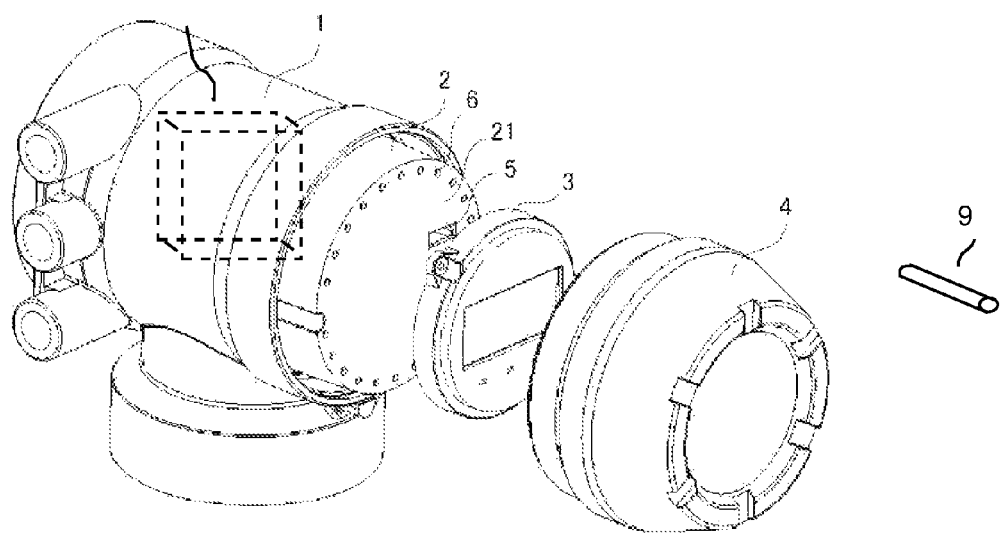
FIG. 1 illustrates a configuration of main parts of an exemplary embodiment of the present invention.
Figure 2:
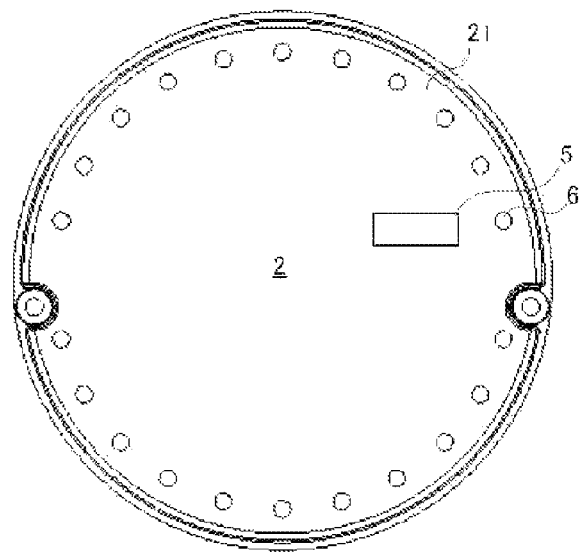
FIG. 2 is a plan view illustrating a main plane 21 of a safety cover 2.
Figure 4:
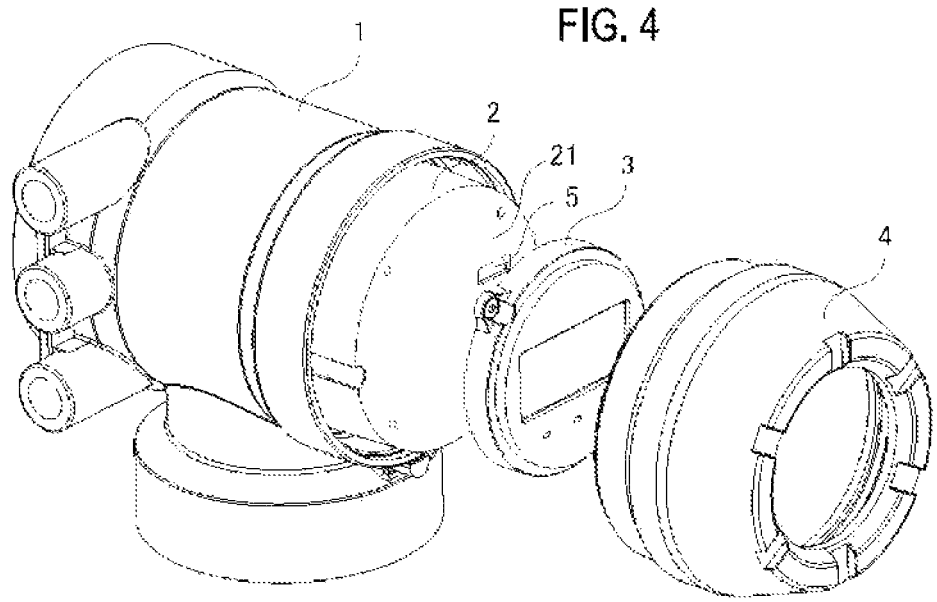
FIG. 4 illustrates a configuration of an example of a related-art converter.

Hereinafter, exemplary embodiments of the present invention will be described in detail with reference to the drawings. FIG. 1 illustrates a configuration of main parts of an exemplary embodiment of the present invention, and FIG. 2 is a plan view illustrating a main plane 21 of a safety cover 2. In FIGS. 1 and 2, the parts common to FIG. 4 are denoted with the same reference numerals. In FIGS. 1 and 2, a plurality of through-holes 6 for gas removal is circumferentially provided in the vicinity of an outer periphery of the main plane 21 of the safety cover 2, to which the indicator 3 cannot be attached.

A size of an opening diameter (inner diameter) of each of the through-holes 6 is configured to be slightly smaller (for example, less than ϕ4) than an outer diameter of a test pin 9 so that the test pin 9 is not fitted therein, for safety purposes, and the number of the through-holes 6 is set so that a gas can easily enter and exit. The test pin 9 has a cylindrical shape with a length of 100 mm and a diameter of 4 mm.

In the above configuration, when an explosion occurs in the amplifier case main body 1, an explosion pressure accompanied by the explosion is enabled to come out through the through-holes 6 serving, as gas removing holes and circumferentially provided on the main plane 21 of the safety cover 2.

Thereby, the explosion pressure accompanied by the explosion is not directly applied to the main plane 21 of the safety cover 2 and an excessive explosion pressure is not applied to the safety cover 2.

Also, it is possible to remarkably reduce the excessive explosion pressure to be applied to a window glass cover 4 without damaging the safety cover 2.

Figure 3:
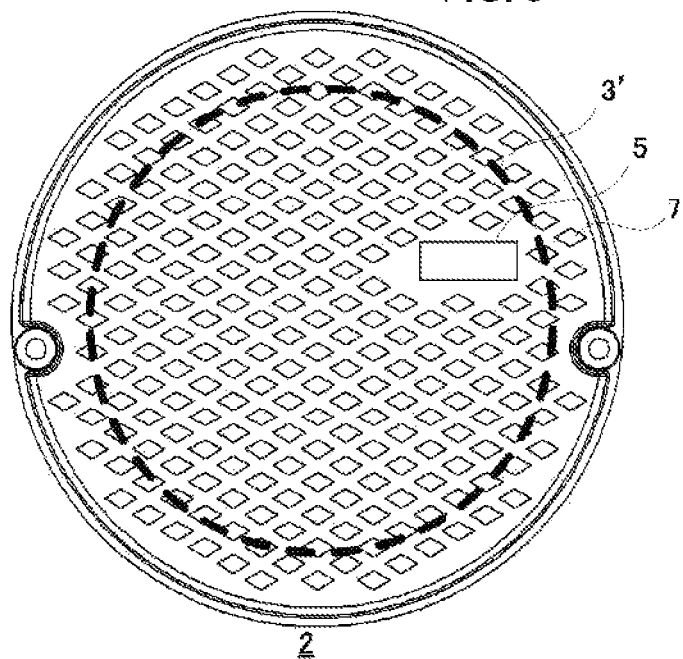
FIG. 3 illustrates a configuration of another exemplary embodiment of the present invention.

FIG. 3 illustrates a configuration of another exemplary embodiment of the present invention, and the parts common to FIG. 2 are denoted with the same reference numerals. In FIG. 3, a plurality of rhombic through-holes 7 is provided in a regular mesh structure on the main plane 21 of the safety cover 2. In the meantime, a dotted line 3' indicates an attachment position of the indicator 3.

According to the structure of FIG. 3, the main plane 21 of the safety cover 2 is configured as the mesh structure consisting of the rhombic through-holes 7 each of which has a size not causing a general safety problem. Thereby, since the gas is enabled to come out through the through-holes 7 positioned at an outer side of the attachment position of the indicator 3, the same effect as the through-holes 6 of FIG. 2 is accomplished.

In the meantime, the mesh structure of the main plane 21 of the safety cover 2 is not limited to the rhombic through-holes 7. That is, circular through-holes can also accomplish the same effect.

Further, the shapes of the through-holes 6 and through-holes 7 provided on the main plane 21 of the safety cover 2 are not limited to the circular and rhombic shapes. That is, the other polygonal shapes such as a triangle, a quadrangle and a pentagon can also be adopted.

As described above, according to the present invention, it is possible to implement the converter capable of reducing not only the damage of the safety cover but also the explosion pressure due to the pressure piling applied to the window glass cover.

What is claimed is:

1. A converter comprising:
an amplifier case main body having an amplifier main body accommodated therein;
an indicator; and
a safety cover attached to the amplifier case main body,
wherein the safety cover has a plurality of through-holes for gas removal, the plurality of through-holes are circumferentially provided along an outer periphery of a main plane of the safety cover at an area in which the indicator is not attached, so as to surround the indicator, and an area of the main plane of the safety cover in which the indicator is attached is not provided with any through-hole.

2. The converter according to claim 1, wherein the through-holes for gas removal are provided in a mesh structure on a main plane of the safety cover.

3. The converter according to claim 2, wherein the through-holes in the mesh structure can comprise at least one shape of a triangle, a quadrangle, and a pentagon.

4. A converter comprising,
an amplifier case main body having an amplifier main body accommodated therein;
an indicator; and
a safety cover attached to the amplifier case main body,
wherein the safety cover has plurality of through-holes for gas removal, the plurality of through-holes circumferentially surrounding the indicator, an inner diameter of each of the through-holes for gas removal being smaller than an outer diameter of a predetermined test pin such that the predetermined test pin cannot be fitted into the through-holes.

* * * * *